United States Patent
Park et al.

(10) Patent No.: US 6,826,743 B2
(45) Date of Patent: Nov. 30, 2004

(54) METHOD FOR AUTOMATICALLY CORRECTING OVERLAY ALIGNMENT OF A SEMICONDUCTOR WAFER

(75) Inventors: Chan-Hoon Park, Seoul (KR); Bong-Su Cho, Sungnam (KR); Hyun-Tae Kang, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 16 days.

(21) Appl. No.: 10/233,556

(22) Filed: Sep. 4, 2002

(65) Prior Publication Data

US 2003/0074639 A1 Apr. 17, 2003

(30) Foreign Application Priority Data

Oct. 11, 2001 (KR) .................................... 2001-0062565

(51) Int. Cl.⁷ .............................................. G06F 17/50
(52) U.S. Cl. ...................................................... 716/21
(58) Field of Search ...................... 716/19–21; 430/22, 430/30; 438/14

(56) References Cited

U.S. PATENT DOCUMENTS

| | | | |
|---|---|---|---|
| 4,910,679 A | * | 3/1990 | Takahashi et al. ............ 716/21 |
| 5,711,843 A | | 1/1998 | Jahns |
| 5,989,762 A | * | 11/1999 | Takaoka ...................... 430/30 |
| 6,085,183 A | | 7/2000 | Horn et al. |
| 6,368,883 B1 | * | 4/2002 | Bode et al. ................... 438/14 |

FOREIGN PATENT DOCUMENTS

JP              1-120819            5/1989

* cited by examiner

*Primary Examiner*—Vuthe Siek
*Assistant Examiner*—Paul Dinh
(74) *Attorney, Agent, or Firm*—Lee & Sterba, P.C.

(57) ABSTRACT

A semiconductor wafer overlay correction method for an exposure process in a semiconductor fabricating stepper incorporates variations in equipment characteristics with time. The wafer overlay correction method includes measuring an overlay error correction value of a semiconductor wafer that is exposed by the stepper, calculating an overlay error correction value by summing the measured overlay error correction value, a variation in the stepper characteristics that is obtained through an empirical characterization of input changes, and a weighting value obtained from a predetermined plurality of wafer lots, and providing the calculated overlay error correction value to the semiconductor fabricating stepper to control an exposure process of a subsequent wafer lot.

1 Claim, 3 Drawing Sheets

METHOD FOR AUTOMATICALLY CORRECTING OVERLAY ALIGNMENT OF A SEMICONDUCTOR WAFER

BACKGROUND OF THE INVENTION

1. Field of the Invention

The present invention relates to overlay alignment of a stepper in the fabrication of a semiconductor device. More particularly, the present invention relates to an overlay correction method for aligning semiconductor wafers that are exposed by a stepper.

2. Description of the Related Art

In order to fabricate semiconductor devices, silicon wafers typically undergo various processes, such as cleaning, diffusion, photoresist coating, exposure, developing, etching, ion-implantation, and the like. Each one of these processes requires a corresponding piece of equipment. For an exposure process, a stepper is used to expose photoresists that have been coated on the wafers using light from a light source, so that the wafers may be patterned during subsequent developing and etching processes.

In the exposure process, a predetermined number of wafers that have been coated with a photoresist are loaded into a carrier, which is then loaded on a table in the stepper. Since the wafers are typically exposed one layer at a time in the stepper, a fetch arm enters the carrier to select and grip one wafer to initiate the exposure process. Next, the table displaces by one pitch, thereby extracting one wafer from the carrier. As the wafer is removed from the carrier, a slider moves to receive the wafer and the wafer in the slider is thus transferred to a position where the wafer is to be exposed. The stepper performs an alignment process on the wafer and then steps through an exposure process at every unit chip location on a wafer to form a predetermined pattern on the wafer. Since the wafer needs to be accurately exposed in order to form a highly integrated chip, the wafers require accurate and proper alignment.

A technique for correcting an overlay of a wafer in order to align a wafer accurately has been developed. In this conventional technique, a test wafer from a particular processing batch or lot is exposed, and a test exposure result is fed back to correct any misalignment of the test wafer. This alignment correction is stored and later used for aligning each wafer in that particular processing batch or lot.

FIG. 1 illustrates a diagram of a conventional system for correcting an overlay of a wafer using such a technique. The conventional system of FIG. 1 includes a stepper 10 for performing a photolithographic process on a semiconductor device, an overlay measuring part 12 for measuring three sets of offset wafers during the exposure process in the stepper to create overlay characterization data, an interfacing part 14 connected to the stepper 10 and the overlay measuring part 12 in order to interface data signals that are input/output through a data bus 20, a data server 16 and an operator interface server 18, each of which is connected to the data bus 20.

After the operator interface server 18 is input with various parameters required for the exposure process, associated input parameters are transferred to the interface part 14 via the data bus 20. The input parameters are then input to the stepper 10, which performs an exposure process according to the input parameters. The stepper 10 records and transmits product related process information, such as product title and type of the practically processed semiconductor device, recorded data, process parameters such as information regarding the reticle, or reticules, that were employed during an exposure process, a lot number, and the like to the data server 16 through the interfacing part 14 and the data bus 20. Simultaneously, the overlay measuring part 12 detects and records overlay data of wafers that are exposed in the stepper 10 in order to transmit the result to the data server 16 through the interface part 14 and the data bus 20. The data server 16 receives the overlay data that was measured in the overlay measuring part 12 during an exposure process in order to detect any misalignment and calculate error correction values for the overlay according to the following set of equations, hereinafter referred to as formula I:

$$X(k)=X\_stepper(k)-X\_ffwd(k)-X\_kla(k) \quad [1]$$

$$Z(m)=w1*X(k31\ 1)+w2*X(k-2)+w3*X(k-3) \quad [2]$$

$$X\_stepper(k)=X\_ffwd(k)+Z(m) \quad [3]$$

wherein X(k) is a current overlay alignment value; X_stepper(k) is an error correction value of the overlay; X_ffwd(k) is a reference value for wafer alignment; X_kla(k) is an overlay-measured value; Z(m) is a weighted average value for a latest three lots, w1, w2, w3 are the weighted values; X(k−1) is a latest overlay alignment value; X(k−2) is a second latest overlay alignment value; and X(k−3) is a third latest overlay alignment value.

The overlay error correction value X_stepper(k) in formula I is calculated by summing the weighted average value (w1:w2:w3→5:3:2) of the latest three lots measured in a same history and the reference value X_ffwd(k) for wafer alignment of a lot to be processed. The overlay error correction value X_stepper(k) is applied to the operator interface server 18 and provided as overlay data for an exposure process to be performed for a subsequent lot. At this time, the data server 16 divides and stores overlay data according to a grouping criteria, such as a same load of the same stepper, a same pattern of the same lot, a same device, and the like. Such division of the overlay data by the data server 16 results in forming groups of same types of overlay data, thereby maintaining consistency in data.

Since the conventional overlay correction method as described above is performed by summing only the weighted average value of three lots that are within a range bounded by the latest data and the previous data and the reference value for the wafer alignment of a lot to be processed, variances in equipment characteristics with respect to time are not considered, thereby causing frequent specification failures. Further, there is a disadvantage in that a sample process is required due to a lack of historical data in a production line involving Job Shop Type Production and Small Batch Production.

SUMMARY OF THE INVENTION

In an effort to solve the problems as described above, it is a feature of an embodiment of the present invention to provide, in semiconductor fabricating stepper equipment, a semiconductor wafer overlay correction method for correcting a positioning of an overlay of a semiconductor wafer that incorporates variances in equipment characteristics with respect to time.

It is another feature of an embodiment of the present invention to provide a semiconductor wafer overlay correction method that minimizes initialization time for sampling and exchanging wafers used for calibration of an exposure process for a production line for Job Shop Type Production and Small Batch Production, thereby increasing productivity.

According to an aspect of the present invention, a wafer overlay correction method for an exposure process in a semiconductor fabricating stepper includes measuring an overlay error correction value of a semiconductor wafer that is exposed by the stepper, calculating an overlay error correction value by summing the measured overlay error correction value, a variation in the stepper that is obtained through an empirical characterization of input changes, and a weighted value obtained from a predetermined plurality of lots, and providing the calculated overlay error correction value to the stepper to control an exposure process of a subsequent wafer lot. The predetermined plurality of wafer lots may preferably include the latest ten lots measured in the same history data.

These and other features of the present invention will be readily apparent to those of ordinary skill in the art upon review of the detailed description that follows.

BRIEF DESCRIPTION OF THE DRAWINGS

The foregoing and other features and advantages of the present invention will be better understood from the following detailed description of preferred embodiments with reference to the accompanying drawings, in which.

DETAILED DESCRIPTION OF THE INVENTION

Figure 1:
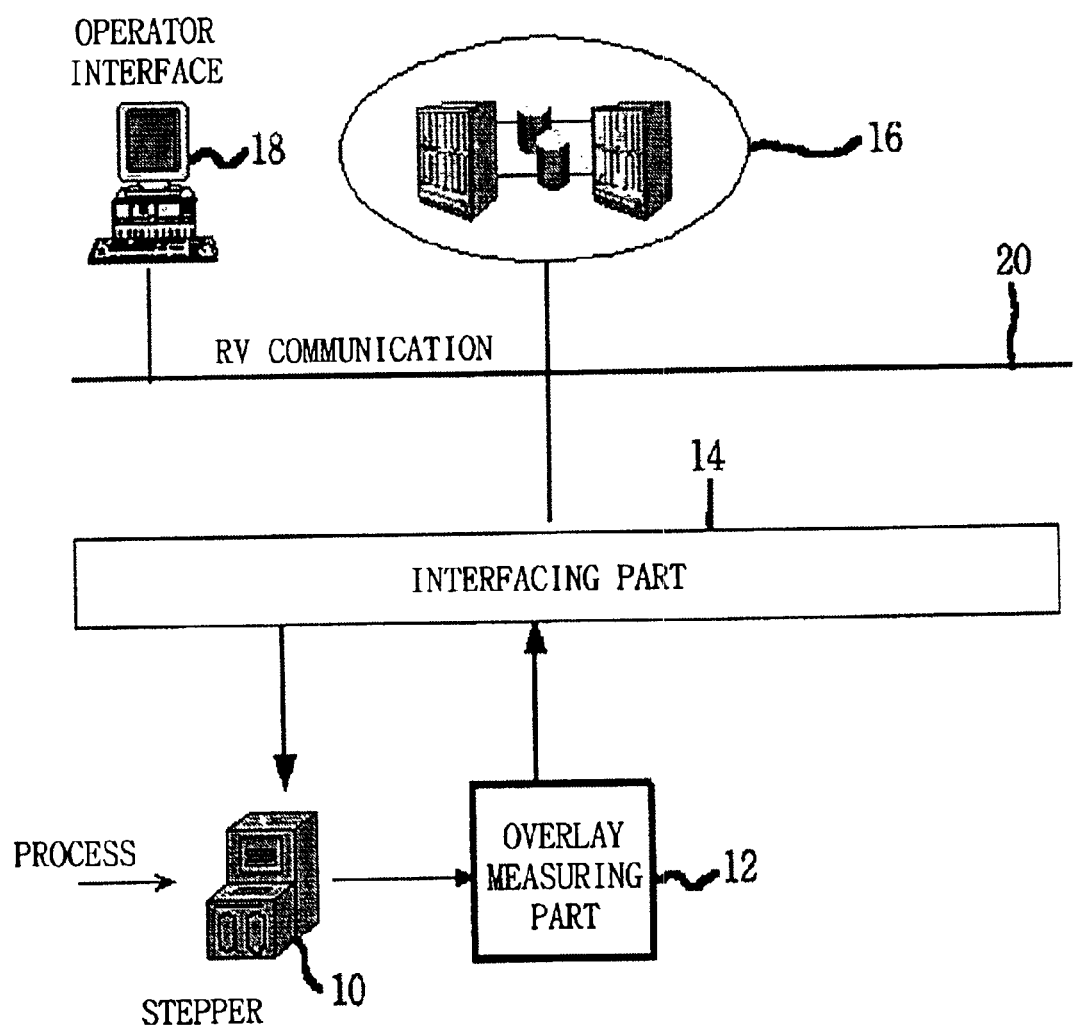
FIG. 1 illustrates a diagram of a conventional system for correcting an overlay alignment of a semiconductor wafer.

Korean Patent Application No. 2001-62565, entitled: "Method for Automatically Correcting Overlay Alignment of Semiconductor Wafer," filed on Oct. 11, 2001, is incorporated by reference herein in its entirety.

In the following description and drawings, like reference numerals are used to denote like elements, and detailed descriptions of well-known functions and structures are omitted.

A method for correcting an overlay alignment of a wafer according to an embodiment of the present invention uses a same hardware system as that shown in FIG. 1, but uses a different algorithm for calculating an overlay error correction value in the data server 16. Since the hardware systems have been described in detail above, a further description will not be repeated here.

Figure 2:
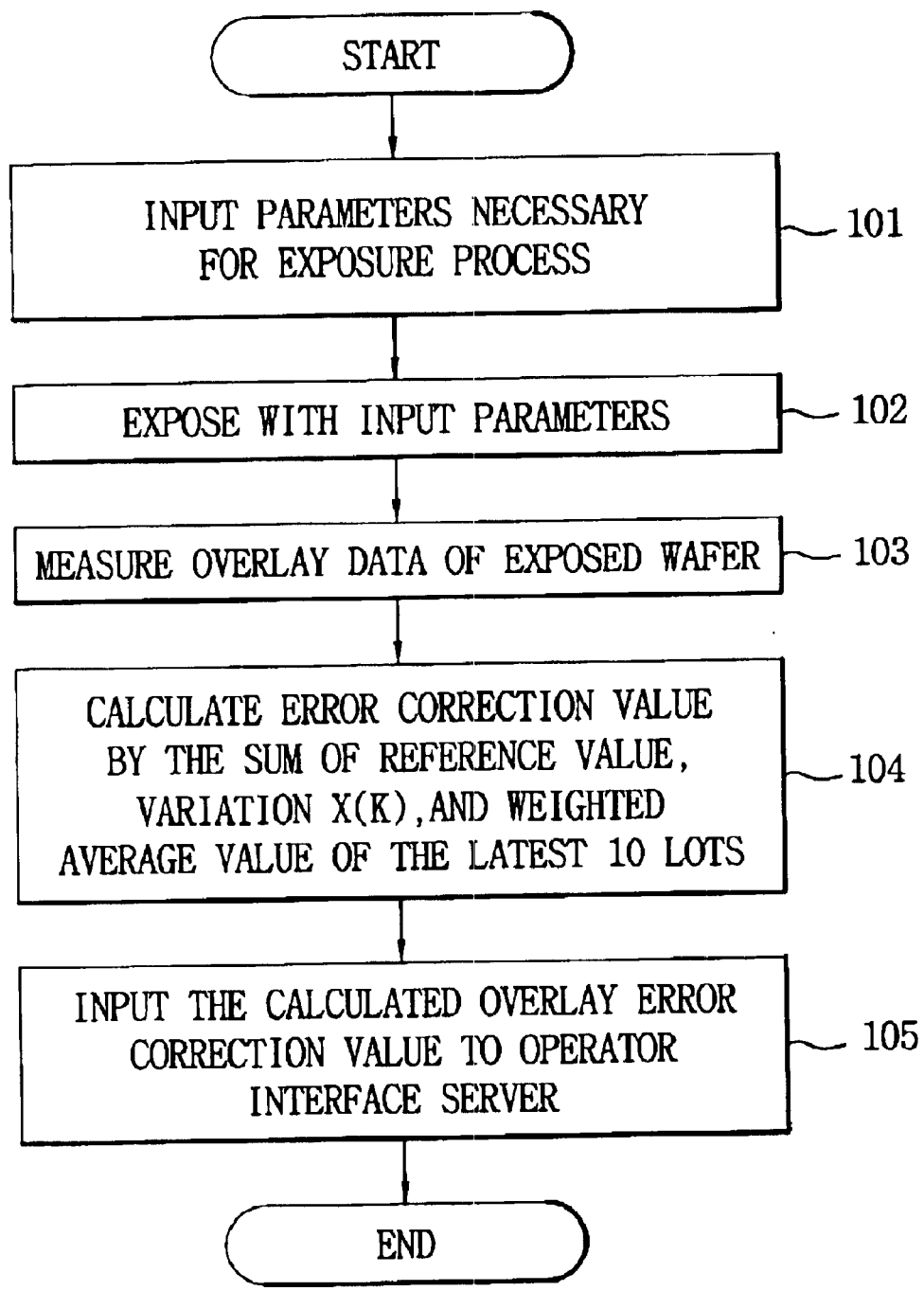
FIG. 2 illustrates a flow chart showing the steps of a method for implementing an overlay error correction process that is used during a semiconductor wafer exposure process according to a preferred embodiment of the present invention.

FIG. 2 illustrates a flow chart showing the steps of a method for implementing an overlay error correction process that is used during a semiconductor wafer exposure process according to a preferred embodiment of the present invention.

Figure 3:
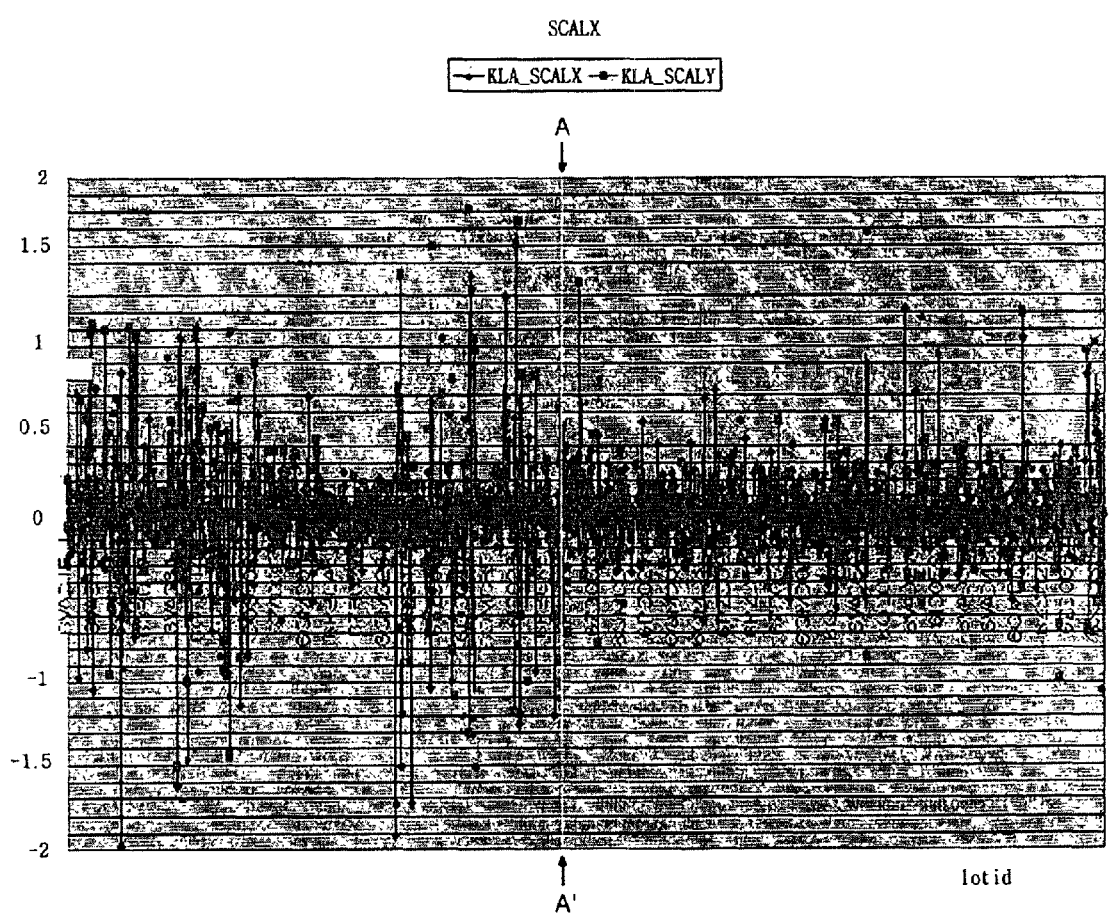
FIG. 3 is an exemplary graph showing results of a comparison of a conventional overlay error correction process with an overlay error correction process according to the present invention.

FIG. 3 is an exemplary graph showing results of comparing an overlay trend that is applied using a conventional overlay error correction method with the overlay trend that is applied using an overlay error correction method according to an embodiment of the present invention.

Referring to FIGS. 1 and 2, in step 101, the operator interface server 18 is input with various parameters necessary to initiate and operate a wafer exposure process. Associated input parameters are transmitted to a stepper 10 via an interfacing part 14 and a data bus 20. In step 102, the stepper 10 initiates an exposure process according to the input parameters. In step 103, an overlay measuring part 12 measures overlay data of wafers exposed in the stepper 10 to thereafter transmit the measured data to a data server 16. In step 104, the data server 16 receives the measured data from the overlay measuring part 12 and calculates an overlay error correction value according to a set of equations, hereinafter referred to as formula II:

$$X(k)=X\_stepper(k)-X\_ffwd(k)-X\_kla(k)-X\_bias(k) \ (k) \qquad [4]$$

$$X\_bias(k)=X\_stepper(m)-X\_ffwd(m)-X\_kla(m)-x(m) \qquad [5]$$

$$x(k)=f[x(k-1),x(k-2),x(k-3),\ldots,x(k-m)] \qquad [6]$$

$$X\_stepper(k)=X\_ffwd(k)+X\_bias(k)+x(k) \qquad [7]$$

wherein $X(k)$ is a current overlay alignment value; $X\_stepper(k)$ is an overlay error correction value; $X\_ffwd(k)$ is a reference value for wafer alignment; $X\_kla(k)$ is an overlay-measured value; $x(k)$ is an estimated value in a variation of equipment through an empirical characterization of input changes; and $X\_bias(k)$ is a weighted average value obtained from the latest ten lots.

The overlay error correction value $X\_stepper(k)$ in formula II is calculated by summing the weighted average value (w1:w2:w3 ... w10→10:9:8 ... :1) of the latest ten lots (i.e., most recently) measured in a same history, the reference value $X\_ffwd(k)$ for wafer alignment of a lot to be processed, and the variation of the stepper 10 through an empirical characterization of input changes in the stepper 10. In step 105, the overlay error correction value $X\_stepper(k)$ thus calculated is transmitted to the operator interface server 18, wherein it is stored as overlay data for an exposure process of a subsequent wafer lot. At this time, the data server 16 preferably divides and stores overlay data according to a grouping criteria, such as a same load of the same stepper, a same pattern of the same lot, a same device, and the like. Such division of the overlay data by the data server 16 results in forming groups of a same type of overlay data, thereby maintaining consistency in the data.

In order to detect a variation in the stepper 10, an optical sensor may receive a light signal that is reflected from a reference mark on a reference plate to form a set pattern of the received light signal thereby determining a current position X of the stepper 10. Thereafter, a standard deviation σ is preferably calculated regarding the predetermined period of time and predetermined number of wafer lots out of the previously measured values. A variation $\Delta X$ may be obtained by calculating a difference value between the measured value of the current position X of the stepper 10 and a previously measured position $X_0$ of the stepper 10. The variation $\Delta X$ thus calculated is transmitted to the data server 16 to be used in correction of an overlay error.

As a result of applying such an overlay error correction method to the stepper 10, a plurality of dimensional parameters, such as OFFSET X/Y (i.e., a data value that is deviated from a reference alignment value in an X-axis or Y-axis), SCAL X/Y (i.e., a data value that is contracted or expanded relative to a reference value), ORTHONALITY (i.e., a data value that is inclined in an X-axis or Y-axis relative to a reference value), WROTY (i.e., a data value that is rotated in a whole direction relative to a reference value), RED X/Y (i.e., Reduction X/Y, a data value corresponding to SCAL X/Y that is obtained when only one chip out of a plurality of chips is measured), RROT X/Y (i.e., Reticle Rotation X/Y, a data value corresponding to WROTY that is obtained when only one chip out of a plurality of chips is measured), which represent data measured in the overlay measuring part 12, become similar or improved in a dispersion and a trend when compared with those obtained using the conventional method.

For instance, as a result of checking an exemplary number of sample recommendations in a piece of stepper equipment (for example, No. 30) during the period of time from Apr. 27, 2001 to May 28, 2001, a sample recommendation using a conventional exposure method was 210 in frequency and the sample recommendation using an exposure process according to the present invention was 19 in frequency. Similarly, in another piece of stepper equipment (for example, No. 62) during the period from May 15, 2001 to May 28, 2001, a sample recommendation using the conventional exposure process was 153 in frequency and a sample recommendation using the exposure process according to the present invention was 24 in frequency.

As a result of the comparison between the conventional overlay correction method and the overlay correction method according to the present invention, the overlay correction method of the present invention significantly decreases the number of sample recommendations over that of the conventional method, thereby resulting in an increase in productivity.

As a result of the application of the conventional overlay correction method, a reworking rate in equipment No. 30 was a representative 5.9% during the period from Mar. 1, 2001 to Mar. 31, 2001. In contrast, as a result of application of the overlay correction method of the present invention, the reworking rate was a representative 2.8% during the same period of time. These results indicate that the overlay correction method of the present invention decreases the reworking rate by a representative 3.1% when compared with the conventional overlay correction method.

Advantageously, according to a preferred embodiment of the present invention, while a semiconductor fabricating stepper performs an exposure process, an overlay error correction value is calculated by summing the measured overlay data and the variation in the stepper state as a weighted value over a representative ten lots, and the exposure process is performed taking the calculated overlay error correction value in account, thereby decreasing the dispersion in the overlay and the number of sampling recommendations, with an attendant increase in productivity. In addition, there is an advantage in that an exposure process is performed with a more accurate pattern and the reworking rate decreases, thereby increasing the working yield.

In FIG. 3, the experimental data to the left of the vertical line A represent the dispersion of overlay-measured values in SCAL X/Y according to a conventional technique. The experimental data to the right of the vertical line A represent the dispersion of overlay-measured values in SCAL X/Y according to the present invention. The symbols ■ represent the deviation from a reference value relative to a Y axis. The symbols ● represent the deviation from a reference value relative to a X axis, every lots. Referring to FIG. 3, it indicates that the deviation of overlay-measured values decreased when compared with that in the conventional technique.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A wafer overlay correction method for an exposure process in a semiconductor fabricating stepper, comprising:

measuring an overlay error correction value of a semiconductor wafer that is exposed by the stepper;

calculating an overlay error correction value by summing the measured overlay error correction value, a variation in the stepper that is obtained through an empirical characterization of input changes, and a weighting value obtained from a predetermined plurality of wafer lots; and providing the calculated overlay error correction value to the stepper to control an exposure process of a subsequent wafer lot.

wherein the overlay error correction value is calculated using the following set of equations:

$$X(k)=X\_stepper(k)-X\_ffwd(k)-X\_kla(k)-X\_bias(k)$$

$$X\_bias(k)=X\_stepper(m)-X\_ffwd(m)-X\_kla(m)-x(m)$$

$$x(k)=f[x(k-1),x(k-2),x(k-3),\ldots,x(k-m)]$$

$$X\_stepper(k)=X\_ffwd(k)+X\_bias(k)+x(k)$$

wherein $X(k)$ is a current overlay alignment value; $X\_stepper(k)$ is an overlay error correction value; $X\_ffwd(k)$ is a reference value for wafer alignment; $X\_kla(k)$ is an overlay-measured value; $x(k)$ is an estimated value in a variation of equipment through an empirical characterization of input changes; and $X\_bias(k)$ is a weighted average value of the latest ten lots.

* * * * *